(12) United States Patent
Guo et al.

(10) Patent No.: US 8,872,260 B2
(45) Date of Patent: Oct. 28, 2014

(54) SEMICONDUCTOR DEVICE FORMATION

(75) Inventors: Jung-Yi Guo, Tainan (TW); Chun-Min Cheng, Hsinchu (TW)

(73) Assignee: Macronix International Co., Ltd. (TW)

( * ) Notice: Subject to any disclaimer, the term of this patent is extended or adjusted under 35 U.S.C. 154(b) by 304 days.

(21) Appl. No.: 13/489,227

(22) Filed: Jun. 5, 2012

(65) Prior Publication Data

US 2013/0320484 A1 Dec. 5, 2013

(51) Int. Cl.
*H01L 29/00* (2006.01)

(52) U.S. Cl.
USPC .... 257/329; 257/330; 257/374; 257/E29.028; 257/E29.201

(58) Field of Classification Search
CPC ............... H01L 29/66621; H01L 21/76229; H01L 29/4236
USPC ............... 257/329, 330, 374, 493, E29.028, 257/E29.201
See application file for complete search history.

(56) References Cited

U.S. PATENT DOCUMENTS

| 7,795,667 B2 * | 9/2010 | Iguchi et al. | 257/316 |
| 7,838,361 B2 * | 11/2010 | Cho et al. | 438/259 |
| 2006/0030137 A1 * | 2/2006 | Kim et al. | 438/592 |

\* cited by examiner

*Primary Examiner* — Minh-Loan Tran
(74) *Attorney, Agent, or Firm* — Baker & McKenzie LLP

(57) ABSTRACT

An apparatus of and method for making a semiconductor structure having a shallow trench isolation (STI) trench with a substantially v-shaped profile, that is the distance between top portions is greater than the distance between bottom portions of shallow trench isolation (STI) structure sidewalls adjacent to the trench, provides for substantially seamless and substantially void-free gate structures. The semiconductor structures are formed by implanting an implantation species into the sidewalls, which allows for the top portions of the sidewalls to be etched away at a greater rate than that of the bottom portions, resulting in the substantially v-shaped profile. And the substantially v-shaped profile allows for subsequent device layers to more easily and smoothly fill in the v-shaped trenches, due to a wider opening toward the tops of the trenches.

23 Claims, 6 Drawing Sheets

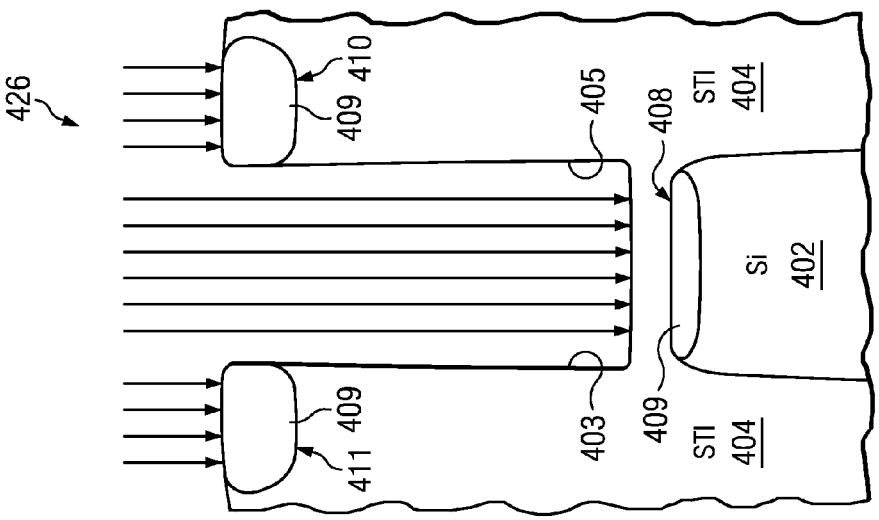
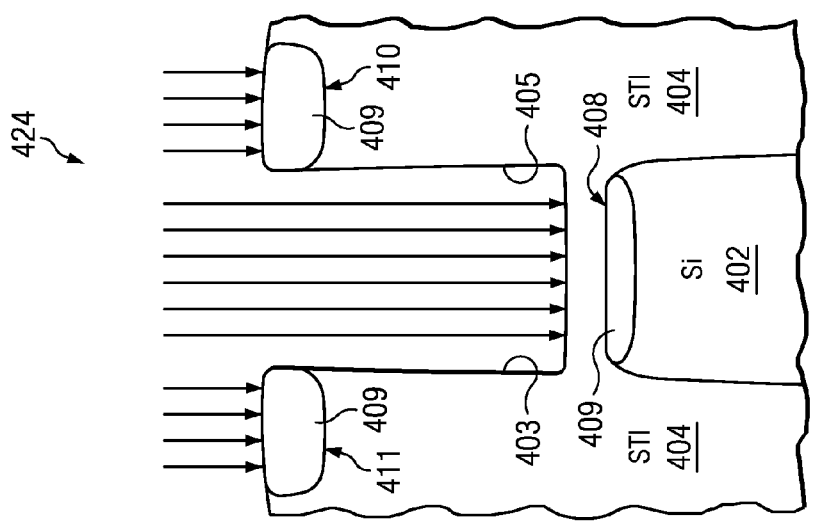
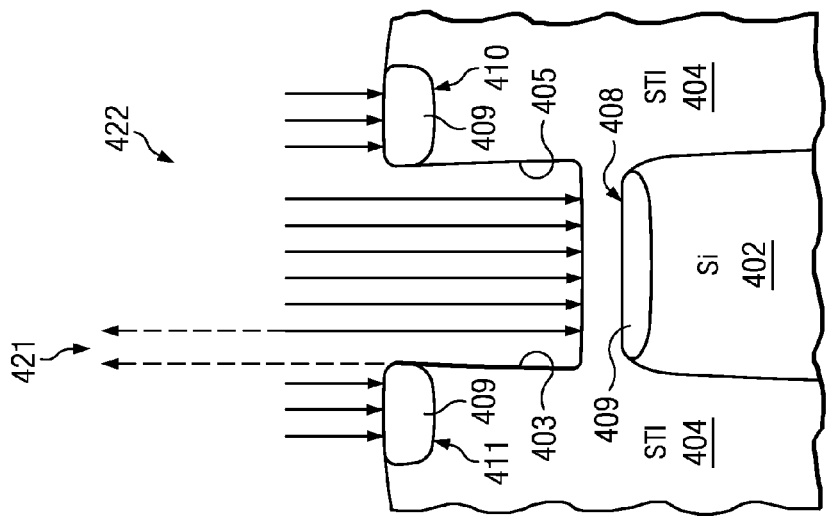

SEMICONDUCTOR DEVICE FORMATION

TECHNICAL FIELD

This disclosure relates generally to semiconductor devices and, more specifically, relates to processes for fabricating non-volatile semiconductor memory devices.

BACKGROUND

Increasing the aspect ratio of gate technologies can lead to voids or large seams occurring during gap fill-in processes. This may decrease gate technology yield and/or may deteriorate gate device performance. Current technologies for addressing this problem are quite complex and inefficient, and typically do not solve the problem of forming void-free and seamless gate structures. Accordingly, what is needed is simple process for forming a void-free and seamless gate structures.

BRIEF SUMMARY

Disclosed herein are substantially void-free and seamless gate semiconductor structures and methods for manufacturing substantially void-free and seamless gate semiconductor structures.

The methods include forming a trench in a semiconductor substrate. The trench has a profile defined by a trench base portion and sidewalls of adjacent shallow trench isolation (STI) structures. The sidewalls are gradually sloped, and a distance between top portions of the sidewalls is greater than a distance between the bottom portions of the sidewalls.

According to an aspect, an implantation species is implanted at a first tilt angle forming implantation regions in a first of the sidewalls of the adjacent shallow trench isolation (STI) structures. The shallow trench isolation (STI) structures, trench, and implantation regions may be annealed. Some or all of the implantation regions may be removed. A tunnel oxide layer is formed over the trench base portion and the sidewalls of the shallow trench isolation (STI) structures. A conductive film is formed over the tunnel oxide layer.

The poly-silicon film may be patterned with a patterning process thereby forming a gate structure.

According to another aspect, the first tilt angle is in the range of 0°-30° with respect to the sidewalls of the shallow trench isolation (STI) structures.

According to another aspect, the first tilt angle is in the range of 10°-70° with respect to the sidewalls of the shallow trench isolation (STI) structures, the semiconductor structure is rotated, and the implantation species is implanted at a second tilt angle, forming implantation regions in a second of the sidewalls of the adjacent shallow trench isolation (STI) structures. The first and second tilt angles may be different or substantially equal, depending on design considerations.

According to another aspect, the implanting and tunnel cleaning may result in pitted structures defined in the top portions of the sidewalls (or portions of the sidewalls adjacent to implanted regions).

According to another aspect, residual implantation regions may remain after the tunnel cleaning process.

According to another aspect, the implantation species comprises implanting one of nitrogen gas ($N_2$), Germanium (Ge), Carbon (C), and Fluorine (F).

Semiconductor structures include shallow trench isolation (STI) regions formed in a semiconductor substrate, thereby defining a trench of the semiconductor structure. The trench comprises an opening defined by a trench base portion and sidewalls of adjacent shallow trench isolation (STI) structures. The sidewalls are gradually sloped and a distance between top portions of the sidewalls is greater than a distance between the bottom portions of the sidewalls.

According to an aspect, pitted structures may be defined in the top portions of the sidewalls.

According to another aspect, residual implantation regions may be defined in the shallow trench isolation (STI) regions adjacent to the top portions of the sidewalls.

BRIEF DESCRIPTION OF THE DRAWINGS

FIGS. 5A, 5B, and 5C are schematic diagrams illustrating various actions of the disclosed processes, in accordance with the present disclosure;

DETAILED DESCRIPTION

Figure 1A:
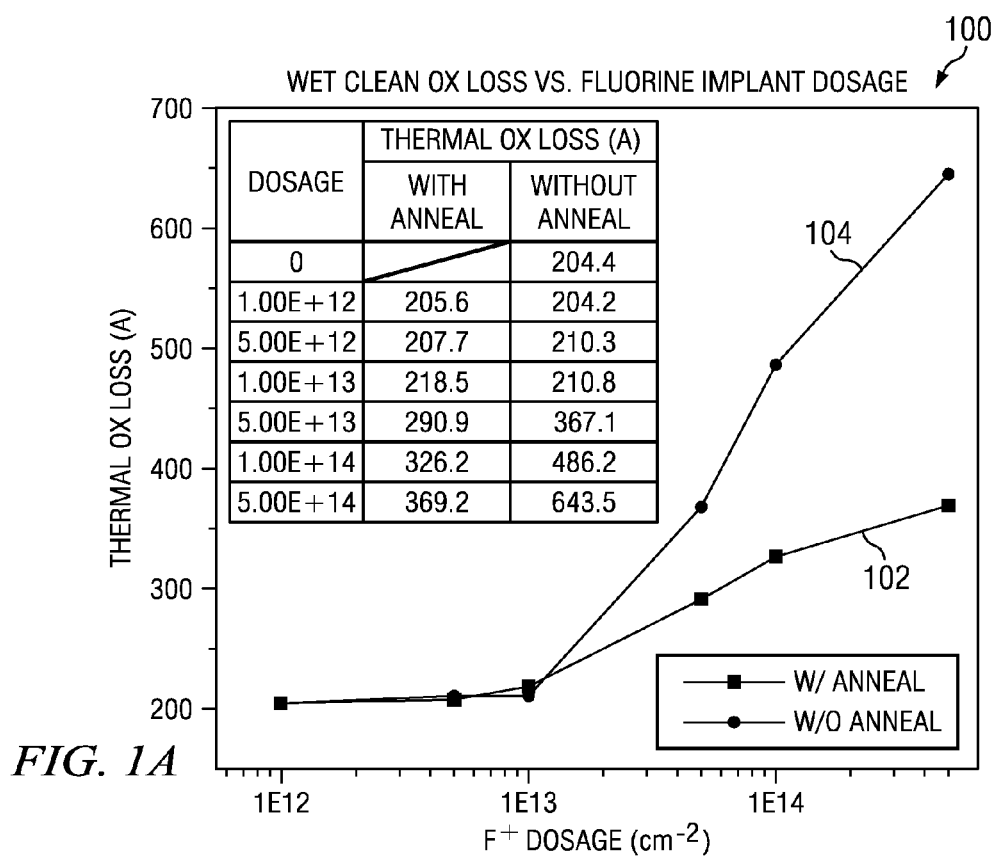
FIGS. 1A and 1B are graphical diagrams illustrating wet clean oxide loss versus for fluorine per fluorine implant dosage and wet clean oxide loss per boron implant dosage, in accordance with the present disclosure.
Figure 1B:
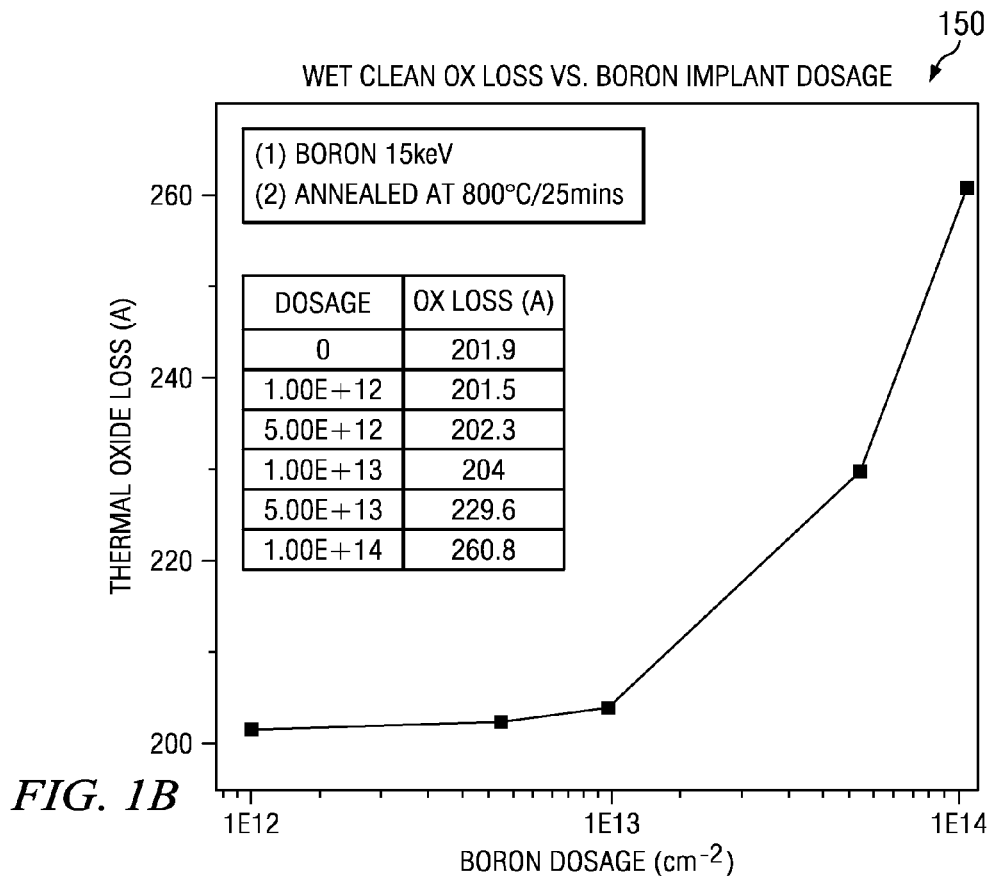

FIGS. 1A and 1B are graphical diagrams illustrating wet clean oxide loss versus for fluorine per fluorine implant dosage 100 and wet clean oxide loss per boron implant dosage 150, respectively. Graph 100 illustrates oxide loss based on a range of fluorine implant dosages both in the annealing context 102 and in the context of without annealing 104. Graph 150 illustrates oxide lost based on a range of boron dosages. Thermal oxide etching rates increase with increasing fluorine or boron dosages when dosages exceed ~1 $E^{13}$. Thus, the annealing process may lower the etching rate, and dosages and annealing processes may be used for tuning desired loss amounts for high-density plasma (HDP) shallow trench isolation (STI) regions.

Figure 2A:
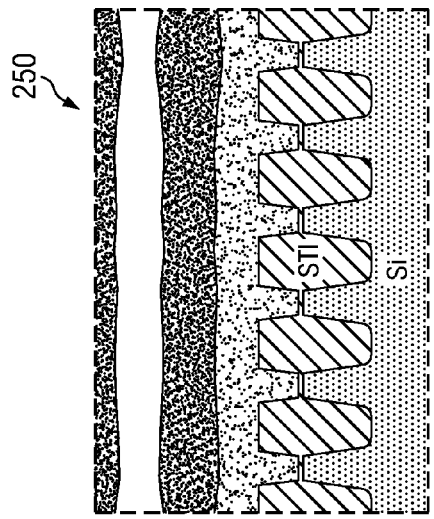
FIGS. 2A-2D are schematic diagrams comparing a standard gate structure device without using the implantation processes discussed in this disclosure with a gate structure device after using a fluorine implantation process, in accordance with the present disclosure.
Figure 2B:
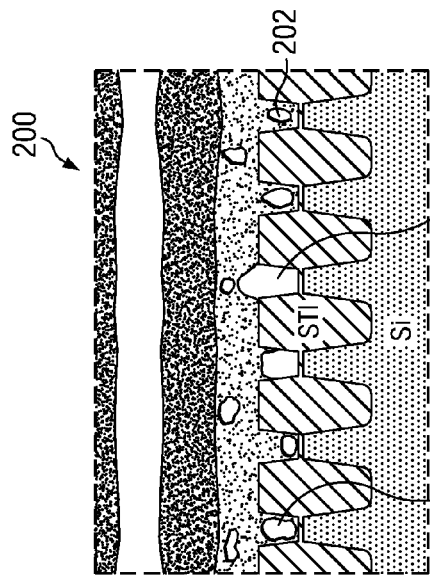
Figure 2C:
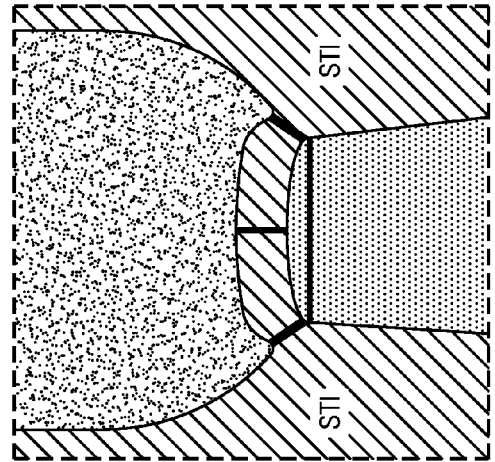
Figure 2D:
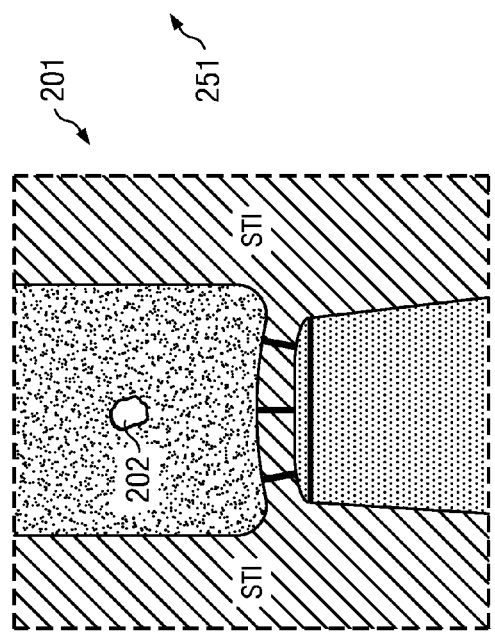

FIGS. 2A-2D are schematic diagrams comparing a standard gate structure device 200, 201 without using the implantation processes discussed in this disclosure with a gate structure device 250, 251 after using a fluorine implantation process. FIGS. 2B and 2D provide a magnified views 201, 251. For example, the fluorine implantation process may be done at an energy level of 15 keV, a dosage of 1.6 $E^{15}$, at a tilt angle of 55°, at a twist of 90°, and with a two-step rotation implant. The gate structure device 250, 251 is substantially seamless and void free, while the standard gate structure device 200, 201 contains voids 202.

The fluorine implantation process using NOR flash 55 nm technology nodes resulted in substantially void-free and seamless gate structure formation.

Figure 3:
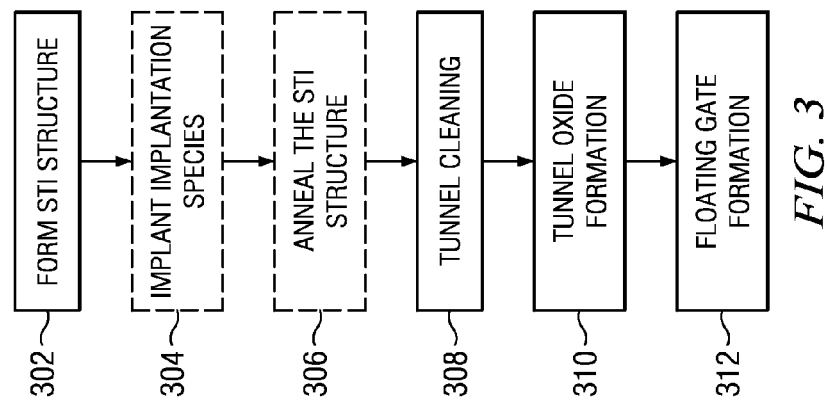
FIG. 3 is a flow diagram illustrating a process for forming a substantially seamless and void free gate structure device, in accordance with the present disclosure.

FIG. 3 is a flow diagram illustrating a process 300 for forming a substantially seamless and void free gate structure device. At action 302, shallow trench isolation (STI) structures are formed in a semiconductor substrate, defining active area trenches of the semiconductor structure.

At action 304, an implantation species is implanted into sidewalls of the shallow trench isolation (STI) structures. The implantation species may be implanted into the sidewalls of the shallow trench isolation (STI) structures by angling an incident ion beam of an implantation species at a variety of angles with respect to the sidewalls of the STI structures.

For example, in some embodiments, the implantation species is implanted at a first angle with respect to a sidewall of a first STI structure and at a second angle with respect to a sidewall of a second STI structure, adjacent to the first STI structure. The first and second angles are preferred to be substantially the same angle, but may also be different angles depending on design considerations. The implantation into the first sidewall and the second sidewall may occur substantially simultaneously or may occur sequentially (i.e., two-step or multi-step implantation). And in the two-step or multi-step implantation scenario, the device may be rotated in between implantations so that the same implantation gun may be used to implant an implantation species into each sidewall. The device may be rotated once, twice, or several times, depending on design considerations. In other embodiments, the implantation species is implanted at a substantially 0° angle (or substantially vertically) with respect to each sidewall of the STI structures. Various implantation embodiments are discussed in greater detail below with respect to FIGS. 4 thru 7.

The implantation species (implanted at action 304) may include, but is not limited to, nitrogen gas ($N_2$), Germanium (Ge), Carbon (C), and Fluorine (F). In an embodiment, the first tilt angle is 55°. In some embodiments, the first tilt angle is in a range of 10°-70°.

Further, at action 304, in some embodiments the implantation species may be implanted at a range of energy values and dosages, which may vary depending on the tilt angle of the incident ion beam. For example, in embodiments in which the implantation species is implanted at a substantially 0° angle (or substantially vertically) with respect to each sidewall of the STI structures, the energy values may range from 1 keV to 20 keV, and the dosages may range from $1E^{12}$ $cm^{-2}$ to $1E^{14}$ $cm^{-2}$. Substantially 0° angle (or substantially vertically) may include tilt angles ranging from 0° to ±30°. In other embodiments in which the implantation species is implanted at a tilt angle ranging from 10°-70° with respect to each sidewall of the STI structures, the energy values may range from 1 keV to 100 keV, at a range of dosages ranging from $1E^{12}$ $cm^{-2}$ to $1E^{16}$ $cm^{-2}$.

At action 306, the shallow trench isolation (STI) structures and trenches are annealed. Annealing the shallow trench isolation (STI) structures (action 306) may include activating a doping species of a cell Vt implant region. In general, the annealing action repairs damage to the semiconductor structure.

In some embodiments, annealing the shallow trench isolation (STI) structures and trenches (action 306) comes before implanting the implantation species into the sidewalls of the shallow trench isolation (STI) structures (action 304). In other embodiments, annealing the shallow trench isolation (STI) structures and trenches (action 306) comes after implanting the implantation species into the sidewalls of the shallow trench isolation (STI) structures (action 304).

At action 308, a tunnel cleaning process is performed in the trenches and sidewalls of the STI structures. The tunnel cleaning process may include an increased etching rate for an area of the sidewalls of the shallow trench isolation (STI) structures that are implanted with the implantation species. At action 310, a tunnel oxide layer is formed over the trenches and sidewalls of the shallow trench isolation (STI) structures. At action 312, a conductive layer is formed on the tunnel oxide layer. Action 312 may include forming a poly-silicon film over the tunnel oxide layer and patterning the poly-silicon film with a patterning process. In this embodiment, the conductive layer is a floating gate, but the processes discussed herein could be applied in other contexts, including, but not limited to, floating gate memory, charge-trapping memory, non-volatile memory, volatile memory, and embedded memory.

FIGS. 4A-4C, 5A-5C, 6A-6C, and 7A-7C are schematic diagrams illustrating gate structure devices formed by various actions of the disclosed processes. FIGS. 4A-4C, 5A-5C, 6A-6C, and 7A-7C also illustrate various aspect ratios for the gate formation. For example, an aspect ratio of ≈1 is shown in FIGS. 4A, 5A, 6A, and 7A at 412, 422, 432, and 452 respectively; an aspect ratio of ≈1.5 is shown in FIGS. 4B, 5B, 6B, and 7B at 414, 424, 434, and 454 respectively; and an aspect ratio of ≈2 is shown in FIGS. 4C, 5C, 6C, and 7C at 416, 426, 436, and 456, respectively.

Figure 4A:
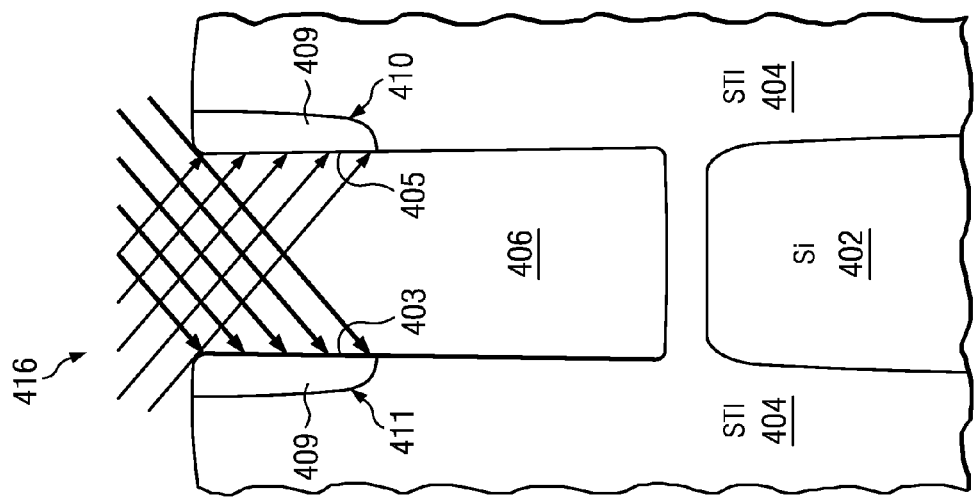
FIGS. 4A, 4B, and 4C are schematic diagrams illustrating various actions of the disclosed processes, in accordance with the present disclosure.
Figure 4B:
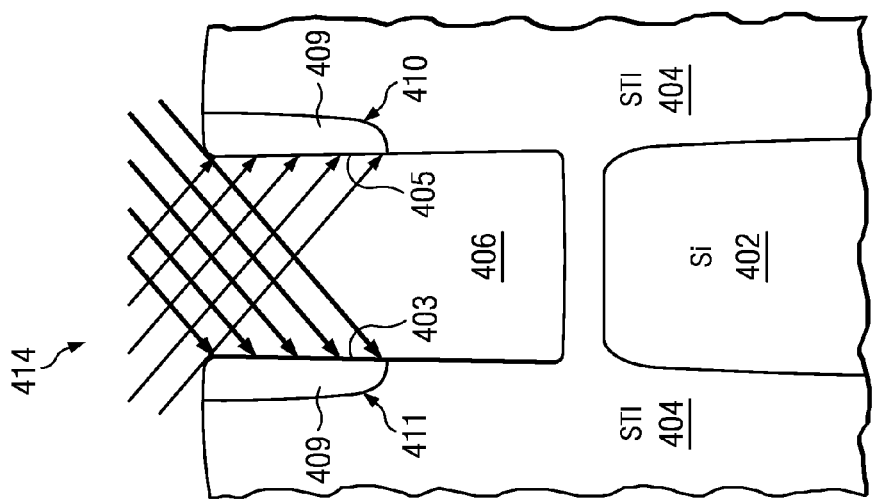
Figure 4C:
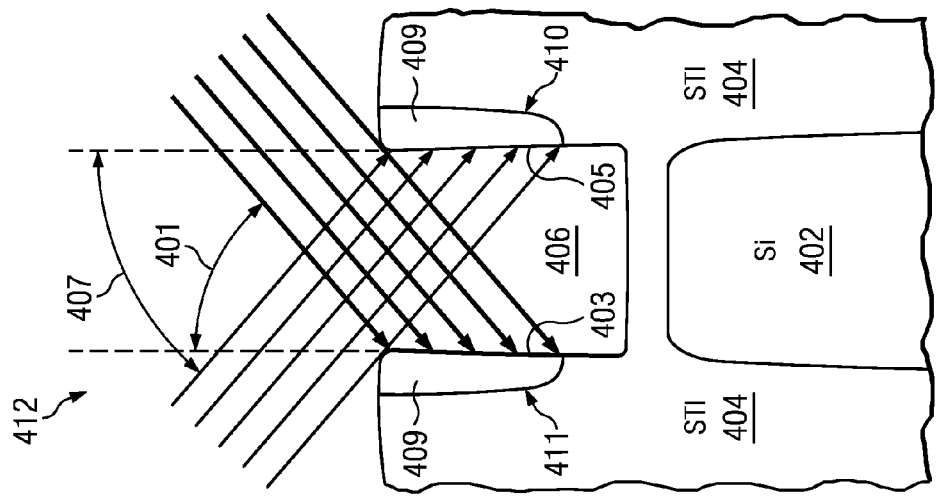

Referring first to FIGS. 4A-4C, a substrate 402 is provided and etched using conventional lithography and etching techniques, resulting in a silicon substrate 402 having a profile. In an embodiment, the substrate 402 is made of silicon. An oxide layer 404 is formed over the silicon substrate 402. A chemical mechanical polishing (CMP) process is applied to the device, resulting in shallow trench isolation (STI) structures 404 and trenches 406. Accordingly, shallow trench isolation (STI) structures 404 are formed over the semiconductor substrate 402, defining active area trenches 406 of the device (e.g., action 302 of FIG. 3).

FIGS. 4A-4C also show implantation species being implanted into the sidewalls 403, 405 of the shallow trench isolation (STI) structures 404 (e.g., action 304 of FIG. 3) forming implantation regions 409. In an embodiment, the implantation species is implanted at a first tilt angle 401 with respect to first sidewalls 403 of the shallow trench isolation (STI) structures 404 forming the implantation regions in first sidewalls 411. The implantation species may be implanted at a second tilt angle 407 with respect to second sidewalls 405 of the shallow trench isolation (STI) structures 404, forming the implantation regions in second sidewalls 410. The implantation species implanted into the first and second sidewalls 403, 405 may occur substantially simultaneously or in sequence. The first and second tilt angles 401, 407 may be substantially equal or may be different.

Further, the implantation into the first and second sidewalls 403, 405 may occur in a two-step or multi-step rotation process (not shown). For example, the implantation species may be implanted into the first sidewall 403 at first tilt angle 401, the device may be rotated by approximately 180°, and the implantation species may be implanted into the second sidewall 405 (which, after rotating by 180°, substantially aligns with the original position of the first side wall 403) using the same implantation gun. Or in other embodiments, the implantation species may be implanted into the first sidewall 403 at first tilt angle 401; the device may be rotated by 90°, and the implantation species may be implanted into another sidewall (which, after rotating by 180°, substantially aligns with the original position of the first side wall 403) using the same implantation gun; the device may be rotated by another 90°, and the implantation species may be implanted into yet another sidewall (which, after rotating by 180°, substantially aligns with the original position of the first side wall 403) using the same implantation gun; etc. Thus the possibilities for implantation into sidewalls and number of rotations is flexible, based on design parameters and the desired size, shape, and depth of implantation regions 409.

In some embodiments, the implantation species may include, but is not limited to, nitrogen gas ($N_2$), Germanium (Ge), Carbon (C), and Fluorine (F). Further, implanting an implantation species may include angling an incident ion beam of an implantation species at tilt angles (e.g., 401, 407). As discussed above in relation to FIG. 3, in an embodiment, the tilt angles may be 55°. In some embodiments, the tilt angles may be in a range of 10°-70°. Further, in some embodiments the implantation species may be implanted at a range of energy values, ranging from 1 keV to 100 keV. Also, the implantation species may be implanted at a range of dosages, ranging from $1E^{12}$ cm$^{-2}$ to $1E^{16}$ cm$^{-2}$. The dosage may be determined based on the desired high-density plasma (HDP) oxide shallow trench isolation (STI) loss.

FIGS. 5A-5C illustrate another embodiment of implantation species being implanted into the sidewalls 403, 405 of the shallow trench isolation (STI) structures 404 (e.g., action 304 of FIG. 3). In an embodiment, the implantation species is implanted at a substantially 0° tilt angle 421 (substantially vertical) with respect to first and second sidewalls 403, 405 of the shallow trench isolation (STI) structures 404. In an embodiment, the implantation species is implanted at the substantially 0° tilt angle 421 into first sidewalls 403 of the shallow trench isolation (STI) structures forming the implantation regions in first sidewalls 411. The implantation species may be implanted at the substantially 0° tilt angle 421 into second sidewalls 405 of the shallow trench isolation (STI) structures 404, forming the implantation regions in second sidewalls 410. The implantation species may also be implanted at the substantially 0° tilt angle 421 into the surface of the silicon substrate 402, forming implantation regions in the surface of the substrate 408. The implantation species implanted into the first and second sidewalls 403, 405 and the surface of the substrate 402 may occur substantially simultaneously or in sequence.

Again, in some embodiments, the implantation species may include, but is not limited to, nitrogen gas ($N_2$), Germanium (Ge), Carbon (C), and Fluorine (F). As discussed above in relation to FIG. 3, in an embodiment, the tilt angles may be 0°. In some embodiments, the tilt angles may be in a range of 0°-30° with respect to the sidewalls 403, 405. Further, in some embodiments the implantation species may be implanted at a range of energy values, ranging from 1 keV to 20 keV. Also, the implantation species may be implanted at a range of dosages, ranging from $1E^{12}$ cm$^{-2}$ to $1E^{14}$ cm$^{-2}$. The dosage may be determined based on the desired high-density plasma (HDP) oxide shallow trench isolation (STI) loss.

Figure 6C:
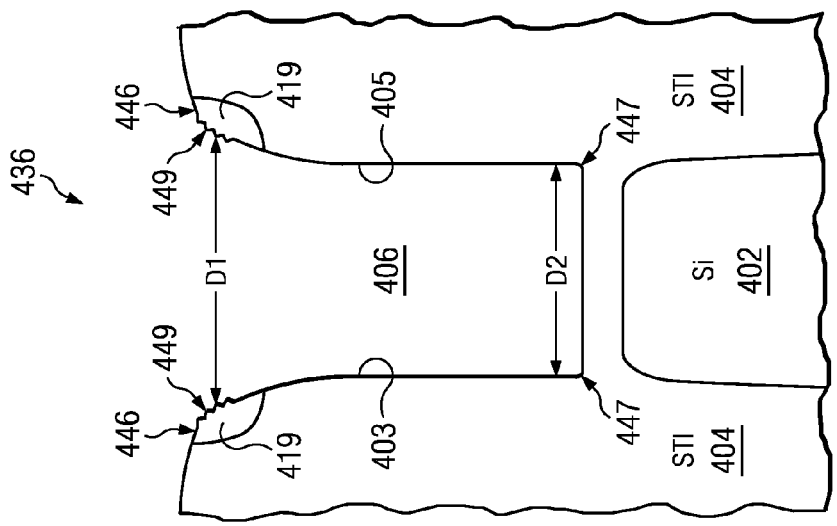
FIGS. 6A, 6B, and 6C are schematic diagrams illustrating various actions of the disclosed processes, in accordance with the present disclosure.
Figure 6B:
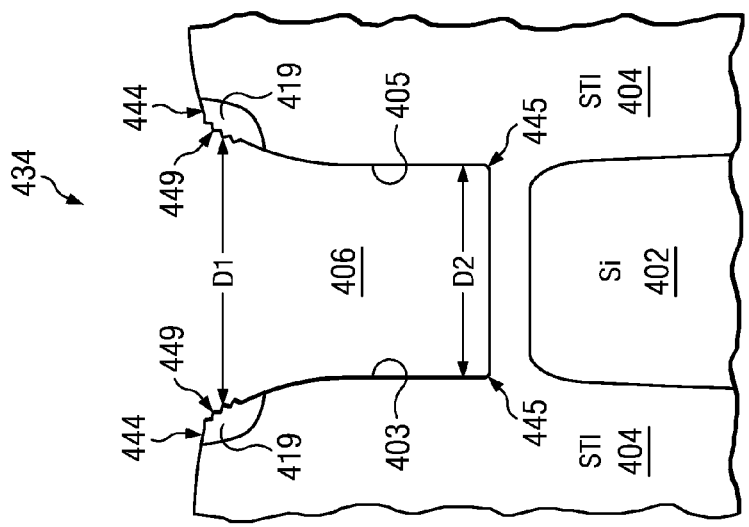
Figure 6A:
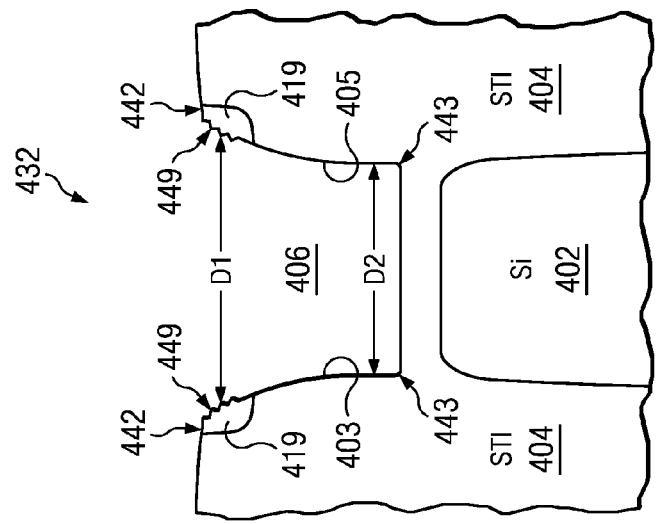

FIGS. 6A-6C illustrate the profile of the device after the tunnel cleaning and tunnel oxide formation, for any of the embodiments discussed above. During the tunnel cleaning process, the implanted regions (409 from FIGS. 4A-4C and 5A-5C) have a higher/faster etching rate than that of non-implanted regions. In other words, the implantation regions will etch more quickly than regions without any implantation species. The resulting profile is shown in FIGS. 6A-6C. The high-density plasma (HDP) loss toward the top portion 442, 444, 446 of the sidewalls 403, 405 of the shallow trench isolation (STI) structures 404 is greater than toward the bottom portion 443, 445, 447 of the sidewalls 403, 405 of the shallow trench isolation (STI) structures 404, resulting in a gradual, v-shaped profile of the STI trenches 406. In other words, the sidewalls 405 are gradually sloped, resulting in gradual, v-shaped active area trenches in the device. Accordingly, a distance D1 between the top portions 442, 444, 446 of the sidewalls 403, 405 is greater than a distance D2 between the bottom portions 443, 445, 447 of the sidewalls 403, 405.

As a result of the implantation and tunnel cleaning processes, rough surfaces (or small, pitted structures) 449 are formed in the top portions 442, 444, 446 of the sidewalls 403, 405. FIGS. 6A-6C shows the pitted structures 449 for illustrative purposes, but the pitted structures would be defined throughout the top portions 442, 444, 446 of the sidewalls 403, 405 (i.e., the portion of the sidewalls adjacent to the implanted regions 409 of FIGS. 4A-4C and 5A-5C). Thus, the surface is more rough toward the top portions 442, 444, 446 of the sidewalls 403, 405 than it is at the bottom portion 443, 445, 447 of the sidewalls 403, 405 of the shallow trench isolation (STI) structures 404.

In some embodiments, the implantation region (409 from FIGS. 4A-4C and 5A-5C) is not removed completely during the tunnel cleaning process. Thus, a residual implantation region 419 may remain. In other embodiments, the tunnel cleaning process removes substantially all of the implantation region (409 from FIGS. 4A-4C and 5A-5C).

In short, the structural damage caused during the implantation process is greatest toward the top portion 442, 444, 446 of the sidewalls 403, 405 of the shallow trench isolation (STI) structures 404, which may allow the top HDP loss to be more significant than the bottom HDP loss and which may cause small pitted structures along the top portion 442, 444, 446 of the sidewalls 403, 405. This allows for the substantially void-free and seamless gate structures because the subsequent layers—e.g., tunnel oxide, poly-silicon, etc.—may more easily and smoothly fill in the v-shaped trenches 406 due to the wider opening toward the tops of the trenches.

Figure 7C:
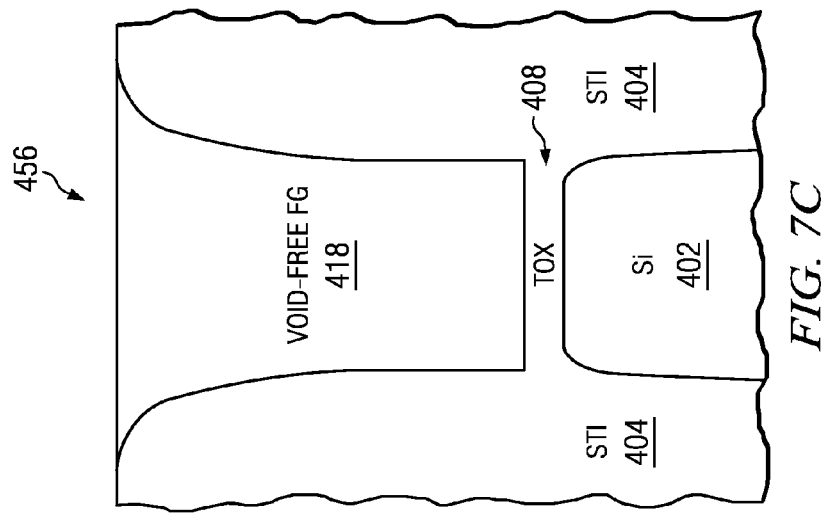
FIGS. 7A, 7B, and 7C are schematic diagrams illustrating gate structure devices formed by various actions of the disclosed processes, in accordance with the present disclosure.
Figure 7B:
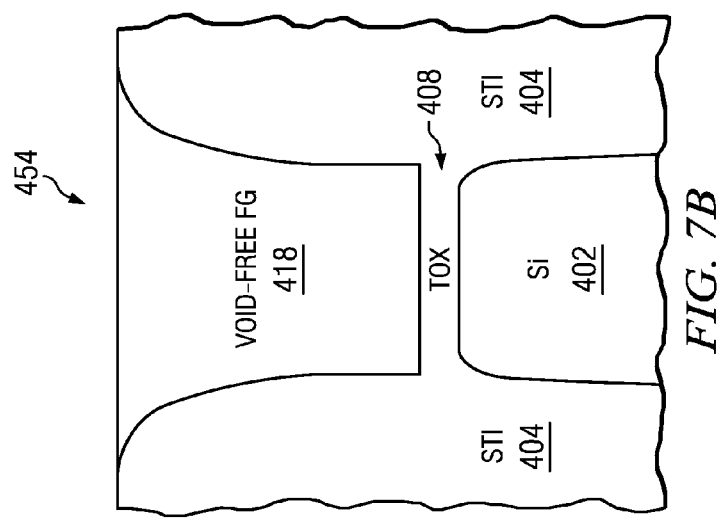
Figure 7A:
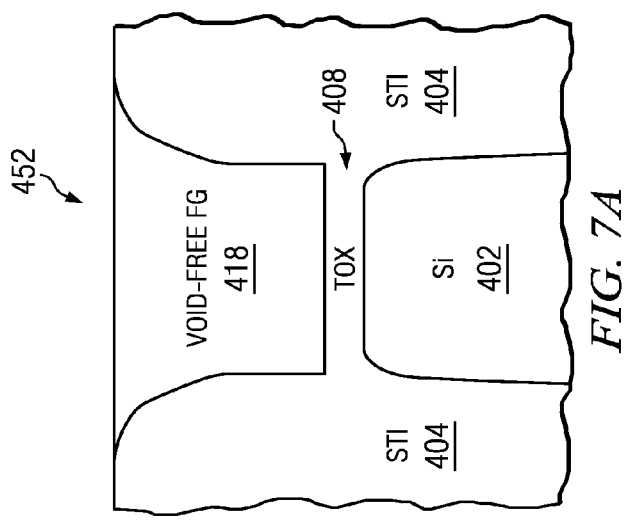

FIGS. 7A-7C illustrate substantially seamless and void-free gate structure devices 452, 454, 456. A tunnel oxide layer 408 is formed over the substrate 402, and a poly-silicon layer 418 is formed over the tunnel oxide 408, resulting in the substantially seamless and void-free gate structures 452, 454, 456.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A method for manufacturing a semiconductor structure, the method comprising:
    forming a trench in a semiconductor substrate, the trench defined by a trench base portion and sidewalls of adjacent shallow trench isolation structures; and
    forming implantation regions in one or more sidewalls of the adjacent shallow trench isolation structures,
    wherein the sidewalls are gradually sloped, and wherein a distance between top portions of the sidewalls is greater than a distance between the bottom portions of the sidewalls.

2. The method of claim 1, further comprising forming a v-shaped opening in the trench.

3. The method of claim 1, further comprising:
    annealing the shallow trench isolation structures, trench, and implantation regions;
    removing portions of the implantation regions;
    forming a tunnel oxide layer over the trench base portion and the sidewalls of the shallow trench isolation structures; and
    forming a conductive film over the tunnel oxide layer.

4. The method of claim 3, wherein forming implantation regions comprises implanting at a first tilt angle to form implantation regions in a first of the sidewalls.

5. The method of claim 4, wherein the first tilt angle is in a range between 0°-30° with respect to the sidewalls of the shallow trench isolation (STI) structures.

6. The method of claim 4, wherein the first tilt angle is substantially 0° with respect to the sidewalls of the shallow trench isolation structures.

7. The method of claim 4, wherein implanting an implantation species at a first tilt angle comprises implanting at an energy ranging from 1 keV to 20 keV and implanting dosages ranging from $1\,E^{12}\,cm^{-2}$ to $1\,E^{14}\,cm^{-2}$.

8. The method of claim 4, further comprising rotating the semiconductor structure.

9. The method of claim 4, wherein forming implantation regions further comprises implanting at a second tilt angle to form implantation regions in a second of the sidewalls.

10. The method of claim 9, wherein the first and second tilt angles are substantially equal.

11. The method of claim 9, wherein the first and second tilt angles are in a range between 10°-70° with respect to the sidewalls.

12. The method of claim 9, wherein the first and second tilt angles are substantially 55° with respect to the sidewalls.

13. The method of claim 3, wherein the forming implantation regions further comprises forming implantation regions in the trench base portion.

14. The method of claim 3, wherein the implanting and removing results in pitted structures defined in the top portions of the sidewalls.

15. The method of claim 14, wherein the top portions of the sidewalls comprise portions of the sidewalls adjacent to implanted regions.

16. The method of claim 3, wherein residual implantation regions remain after the removing.

17. The method of claim 3, wherein implanting an implantation species comprises implanting one of nitrogen gas ($N_2$), Germanium (Ge), Carbon (C), and Fluorine (F).

18. A semiconductor structure, the structure comprising:
    shallow trench isolation regions formed in a semiconductor substrate, thereby defining a trench of the semiconductor structure,
    wherein the trench comprises an opening defined by a trench base portion and sidewalls of adjacent shallow trench isolation structures, and
    wherein the sidewalls are gradually sloped, and a distance between top portions of the sidewalls is greater than a distance between the bottom portions of the sidewalls.

19. The semiconductor structure of claim 18, wherein pitted structures are defined in the top portions of the sidewalls.

20. The semiconductor structure of claim 18, further comprising implantation regions implanted in the top portions of the sidewalls.

21. The semiconductor structure of claim 18, further comprising residual implantation regions defined in the shallow trench isolation regions adjacent to the top portions of the sidewalls.

22. The semiconductor structure of claim 21, wherein the residual implantation regions include implantation species of one of nitrogen gas ($N_2$), Germanium (Ge), Carbon (C), and Fluorine (F).

23. A semiconductor structure, comprising shallow trench isolation regions formed in a semiconductor substrate, thereby defining a trench of the semiconductor substrate, wherein the trench comprises an opening defined by a trench base portion and sidewalls of adjacent shallow trench isolation structures, and wherein a top portion of the sidewalls has a pitted surface.

* * * * *